(12) United States Patent
Sugiyama et al.

(10) Patent No.: US 8,891,712 B2
(45) Date of Patent: Nov. 18, 2014

(54) TRANSMITTING APPARATUS AND TRANSMITTING METHOD

(71) Applicant: Fujitsu Limited, Kawasaki (JP)

(72) Inventors: Junichi Sugiyama, Oyama (JP); Hiroyuki Homma, Kawasaki (JP); Toru Katagiri, Kawasaki (JP); Ichiro Yokokura, Sano (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/770,665

(22) Filed: Feb. 19, 2013

(65) Prior Publication Data

US 2013/0222021 A1 Aug. 29, 2013

(30) Foreign Application Priority Data

Feb. 29, 2012 (JP) ................................. 2012-043597

(51) Int. Cl.
  H04L 7/00  (2006.01)
  H04B 10/00  (2013.01)
  H03L 7/00  (2006.01)
  H04J 3/16  (2006.01)
  H04J 3/06  (2006.01)

(52) U.S. Cl.
  CPC ............. *H03L 7/00* (2013.01); *H04J 3/1664* (2013.01); *H04J 3/0691* (2013.01)
  USPC .......................................... 375/354; 398/154

(58) Field of Classification Search
  CPC ..... H04J 14/0298; H04J 14/02; H04J 3/1652; H04J 3/0685; H04J 3/0691; H04J 3/1664; A61B 5/0017; H01L 23/576; H04Q 11/0067; H04Q 2011/0045; H03L 7/00

USPC ............................................. 375/354; 398/154
  See application file for complete search history.

(56) References Cited

U.S. PATENT DOCUMENTS

| | | | | |
|---|---|---|---|---|
| 5,477,181 A | * | 12/1995 | Li et al. ........................ | 327/258 |
| 6,229,633 B1 | * | 5/2001 | Roberts et al. .................... | 398/9 |
| 8,283,959 B2 | | 10/2012 | Demone | |
| 8,401,546 B2 | * | 3/2013 | Landry et al. ................. | 455/427 |
| 2003/0016416 A1 | * | 1/2003 | Wolf ............................. | 359/139 |
| 2005/0036572 A1 | * | 2/2005 | Muhammad et al. ......... | 375/322 |
| 2007/0025397 A1 | * | 2/2007 | Sticht et al. .................... | 370/503 |

FOREIGN PATENT DOCUMENTS

| | | |
|---|---|---|
| JP | 2000-353027 | 12/2000 |
| JP | 2005-122457 | 5/2005 |
| JP | 2010-74859 | 4/2010 |

OTHER PUBLICATIONS

ITU-T G.709/Y.1331 (Dec. 2009), "Interfaces for the Optical Transport Network (OTN)", pp. 1-207.

* cited by examiner

*Primary Examiner* — Vineeta Panwalkar
(74) *Attorney, Agent, or Firm* — Fujitsu Patent Center

(57) ABSTRACT

A transmitting apparatus includes a first circuit to which a base clock and a first clock condition are input, the first circuit outputting a first enable signal based on the base clock and the first clock condition; a second circuit to which the base clock and a second clock condition are input, the second circuit outputting a second enable signal based on the base clock and the second clock condition; a first frame processing circuit receiving a first frame input signal and the first enable signal to output a first frame output signal in synchronization with the first enable signal; and a second frame processing circuit receiving a second frame input signal and the second enable signal to output a second frame output signal in synchronization with the second enable signal.

12 Claims, 16 Drawing Sheets

FIG.13

| FF (A1) OUTPUT | AD1 | AD2 | AD3 | AD4 | AD5 | AD6 | AD7 | | |
| --- | --- | --- | --- | --- | --- | --- | --- | --- | --- |
| LA1 OUTPUT | LAD1 | LAD2 | LAD3 | LAD4 | LAD5 | LAD6 | LAD7 | | |
| FF (A2) OUTPUT | | LAD1 | LAD2 | LAD3 | LAD4 | LAD5 | LAD6 | | |
| FF (B1) OUTPUT | | BD1 | BD2 | BD3 | BD4 | BD5 | BD6 | BD7 | |
| LB1 OUTPUT | | LBD1 | LBD2 | LBD3 | LBD4 | LBD5 | LBD6 | LBD7 | |
| FF (B2) OUTPUT | | | LBD1 | LBD2 | LBD3 | LBD4 | LBD5 | LBD6 | |

TRANSMITTING APPARATUS AND TRANSMITTING METHOD

CROSS REFERENCE TO RELATED APPLICATIONS

This application is based upon and claims the benefit of priority of the prior Japanese Patent Application No. 2012-043597, filed on Feb. 29, 2012, the entire contents of which are incorporated herein by reference.

FIELD

The embodiments discussed herein are related to a transmitting apparatus and a transmitting method.

BACKGROUND

With regard to clock transmission, a clock transmission circuit is conventionally known that generates a low-speed clock having a frequency of ½ to the power of m (m is a natural number) from a high-speed clock and that restores and supplies to a given circuit, a high-speed clock having a frequency of 2 to the power n (n is a natural number) from this low-speed clock (see, e.g., Japanese Laid-Open Patent Publication No. 2005-122457). A frequency-multiplying circuit is known that generates a clock having a frequency multiplied based on a clock delayed by stages of delay elements (see, e.g., Japanese Laid-Open Patent Publication No. 2010-74859). A control method is known that generates a synchronizing signal from clocks having different frequencies, to match timing to other clocks having different frequencies based on the synchronizing signal and clocks (see, e.g., Japanese Laid-Open Patent Publication No. 2000-353027).

If a first signal synchronized with a first clock is converted into a second signal having a frequency synchronized with a second clock different from the first clock, the second clock must be supplied to a circuit block executing the signal conversion process. If the second signal is further converted into a third signal having a frequency synchronized with a third clock different from the first and second clocks, the third clock must be supplied to a circuit block executing the signal conversion process.

A transmitting apparatus including such multi-stage signal processing circuits has clock resources supplying the second and third clocks described above. Therefore, the number of crystal oscillators increases, disadvantageously causing increases in circuit scale, cost, and power consumption. Such disadvantages cannot be eliminated by a conventional circuit transmitting a clock, multiplying a frequency of a clock, or controlling a timing of a clock.

SUMMARY

According to an aspect of an embodiment, a transmitting apparatus includes a first circuit to which a base clock and a first clock condition are input, the first circuit outputting a first enable signal based on the base clock and the first clock condition; a second circuit to which the base clock and a second clock condition are input, the second circuit outputting a second enable signal based on the base clock and the second clock condition; a first frame processing circuit receiving a first frame input signal and the first enable signal to output a first frame output signal in synchronization with the first enable signal; and a second frame processing circuit receiving a second frame input signal and the second enable signal to output a second frame output signal in synchronization with the second enable signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 is a timing chart of the operation of the circuit depicted in FIG. 12.

DESCRIPTION OF EMBODIMENTS

Figure 1:
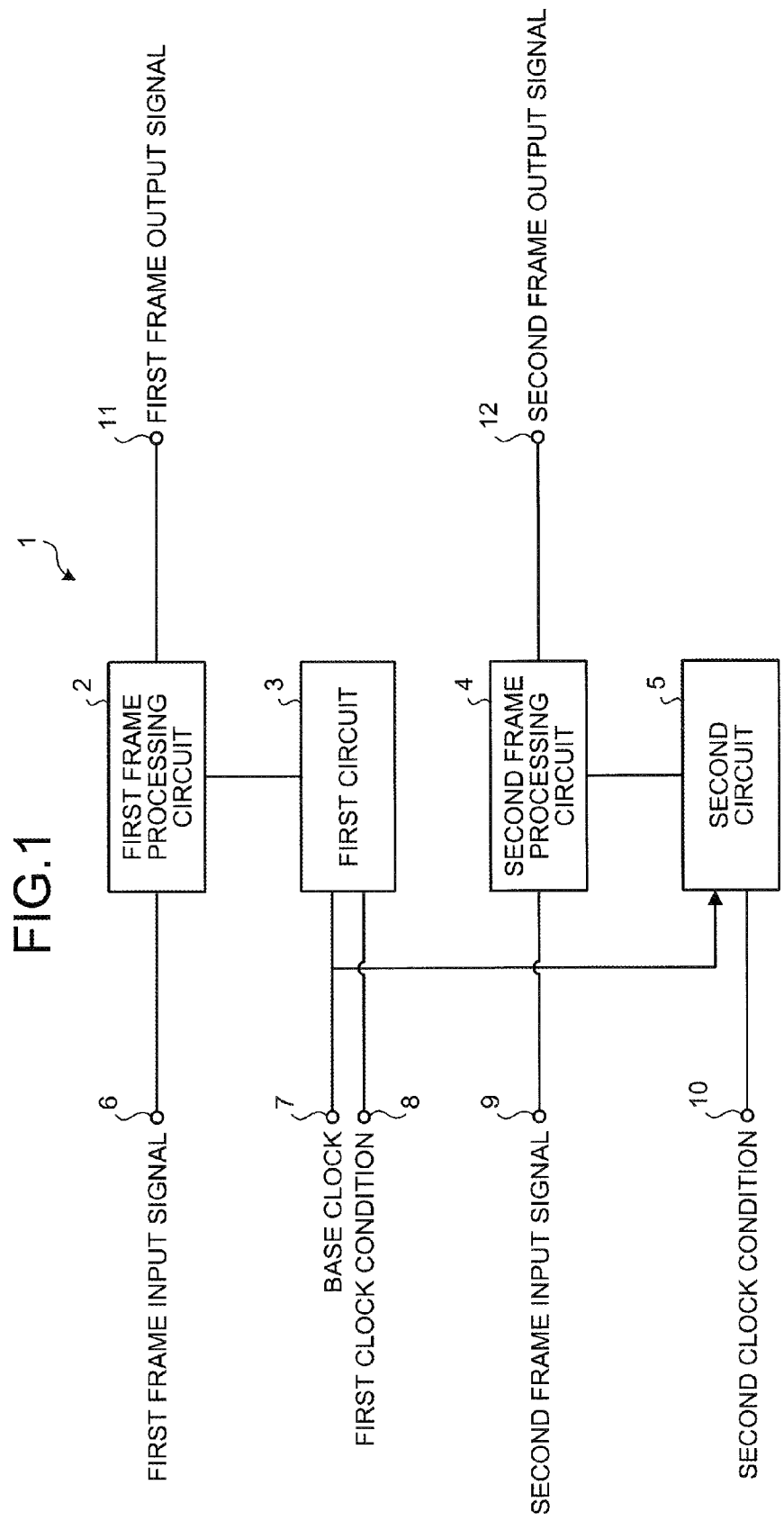
FIG. 1 is a block diagram of a transmitting apparatus according to a first embodiment.

Preferred embodiments of the present invention will be explained with reference to the accompanying drawings. In the embodiments, identical components are given the same reference numerals and redundant description thereof is omitted.

FIG. 1 is a block diagram of a transmitting apparatus according to a first embodiment. As depicted in FIG. 1, a transmitting apparatus 1 includes a first frame processing circuit 2, a first circuit 3, a second frame processing circuit 4, and a second circuit 5.

The first circuit 3 is connected to an input terminal 7 for a base clock and an input terminal 8 for a first clock condition. To the first circuit 3, the base clock is input from the input terminal 7 for the base clock. To the first circuit 3, the first clock condition is input from the input terminal 8 for the first clock condition. The first circuit 3 outputs a first enable signal based on the base clock and the first clock condition.

The first frame processing circuit 2 is connected to an input terminal 6 for a first frame input signal and to the first circuit 3. To the first frame processing circuit 2, the first frame input signal is input from the input terminal 6 for the first frame input signal. To the first frame processing circuit 2, the first enable signal is input from the first circuit 3. The first frame processing circuit 2 receives the first frame input signal and the first enable signal and outputs a first frame output signal synchronized with the first enable signal. The first frame output signal output from the first frame processing circuit 2 is output from an output terminal 11 for the first frame output signal.

The second circuit 5 is connected to the input terminal 7 for the base clock and an input terminal 10 for a second clock condition. To the second circuit 5, the base clock is input from the input terminal 7 for the base clock. To the second circuit 5, the second clock condition is input from the input terminal 10 for the second clock condition. The second circuit 5 outputs a second enable signal based on the base clock and the second clock condition. The frequency of the second enable signal may be different from the frequency of the first enable signal.

The second frame processing circuit 4 is connected to an input terminal 9 for a second frame input signal and to the second circuit 5. To the second frame processing circuit 4, the second frame input signal is input from the input terminal 9 for the second frame input signal. To the second frame processing circuit 4, the second enable signal is input from the second circuit 5. The second frame processing circuit 4 receives the second frame input signal and the second enable signal and outputs a second frame output signal synchronized with the second enable signal. The second frame output signal output from the second frame processing circuit 4 is output from an output terminal 12 for the second frame output signal.

Figure 2:
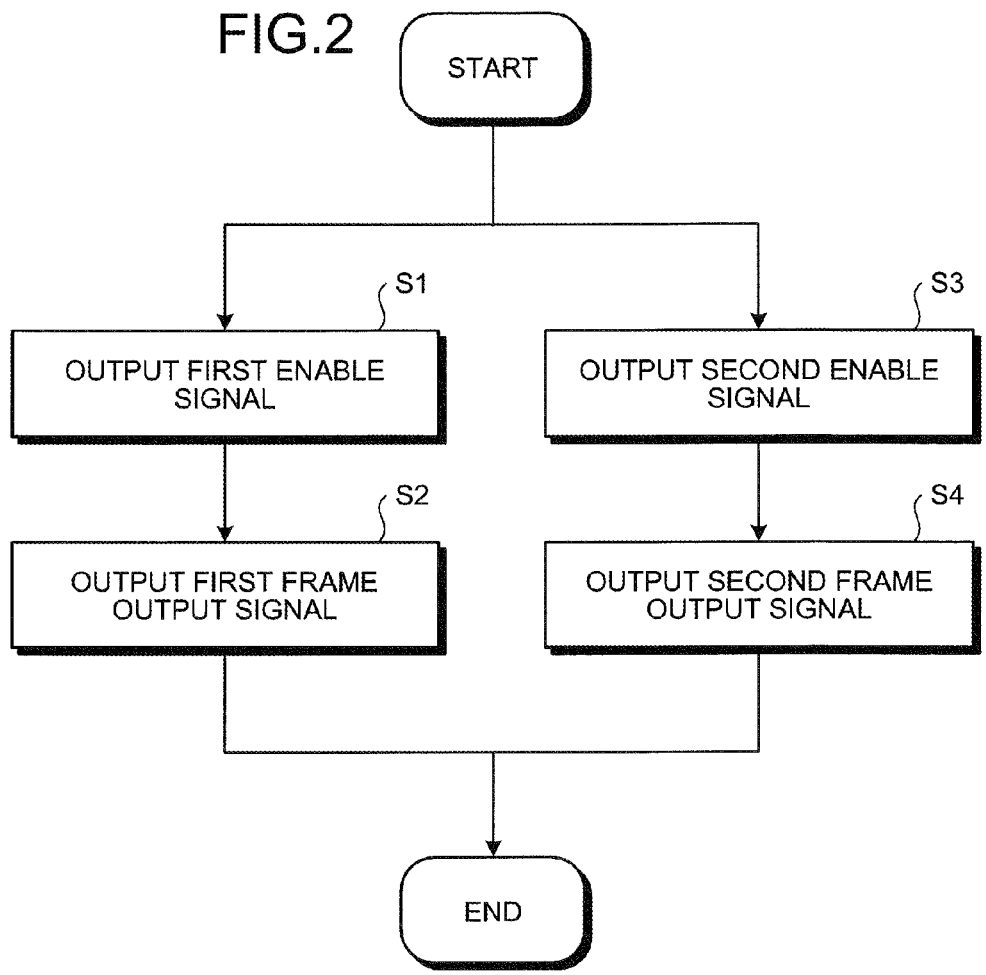
FIG. 2 is a flowchart of a transmitting method according to the first embodiment.

FIG. 2 is a flowchart of a transmitting method according to the first embodiment. As depicted in FIG. 2, in the transmitting apparatus 1, the first circuit 3 outputs the first enable signal based on the base clock and the first clock condition (step S1). The first frame processing circuit 2 receives the first frame input signal and the first enable signal and outputs the first frame output signal synchronized with the first enable signal (step S2).

In the transmitting apparatus 1, the second circuit 5 outputs the second enable signal based on the base clock and the second clock condition (step S3). The second frame processing circuit 4 receives the second frame input signal and the second enable signal and outputs the second frame output signal synchronized with the second enable signal (step S4).

According to the first embodiment, the first frame input signal is processed with the first enable signal generated from the base clock. The second frame input signal is processed with the second enable signal generated from the base clock. If the frequency of the first enable signal is different from the frequency of the second enable signal, the transmitting apparatus 1 can process multiple types of signals synchronized with clocks having different frequencies based on a single clock.

In a second embodiment, the transmitting apparatus and the transmitting method according to the first embodiment are applied to an OTN transmitting apparatus that multiplexes a wide variety of frames to perform communication and a transmitting method of the OTN transmitting apparatus. OTN is described in ITU-T G.709/Y.1331 (12/2009), "Interfaces for the Optical Transport Network (OTN)".

Figure 3:
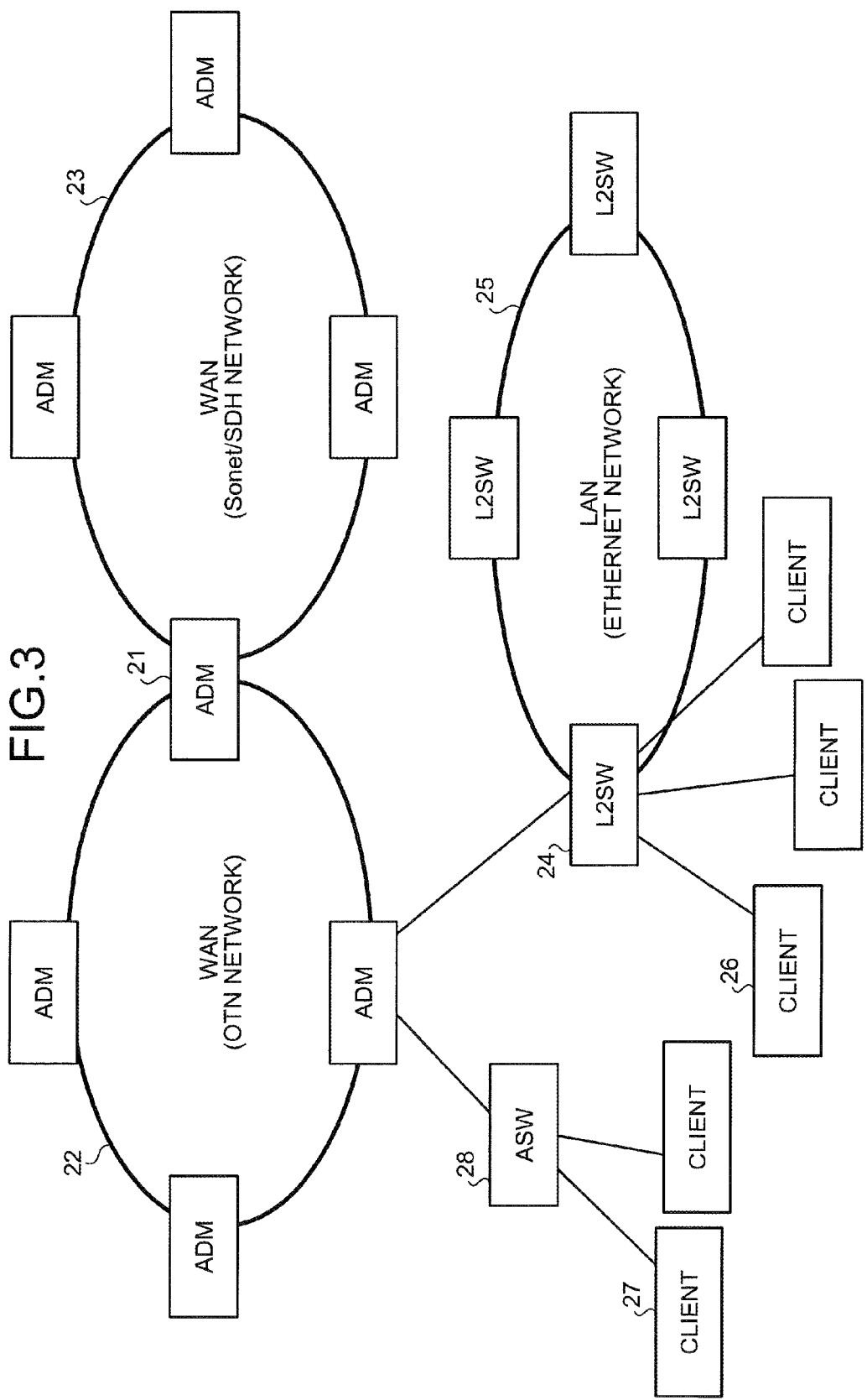
FIG. 3 is a schematic of an example of a network system.

FIG. 3 is a schematic of an example of a network system. In a transmission system depicted in FIG. 3, an ADM 21 is used for adding data from a client to a network and taking and delivering data from a network to a client in WANs such as an OTN network 22 and a Sonet/SDH network 23, for example. Data is transmitted via the ADM 21 between the OTN network 22 and the Sonet/SDH network 23.

Between the OTN network 22 and a LAN such as an Ethernet (registered trademark) network 25, data is transmitted via the ADM 21 of the OTN network 22 and an L2SW 24 of the Ethernet network 25. A client 26 of the Ethernet network 25 can send data to the Ethernet network 25 and receive data from the Ethernet network 25 via the L2SW 24. A client 27 of the OTN network 22 can send data to the OTN network 22 and receive data from the OTN network 22 via an ASW 28.

OTN is an abbreviation for Optical Transport Network. ADM is an abbreviation for Add/Drop Multiplexer. Sonet is an abbreviation for Synchronous Optical network. SDH is an abbreviation for Synchronous Digital Hierarchy. WAN is an abbreviation for Wide Area Network. L2SW is an abbreviation for L2 Switch. LAN is an abbreviation for Local Area Network. ASW is an abbreviation for Aggregate Switch.

Figure 4:
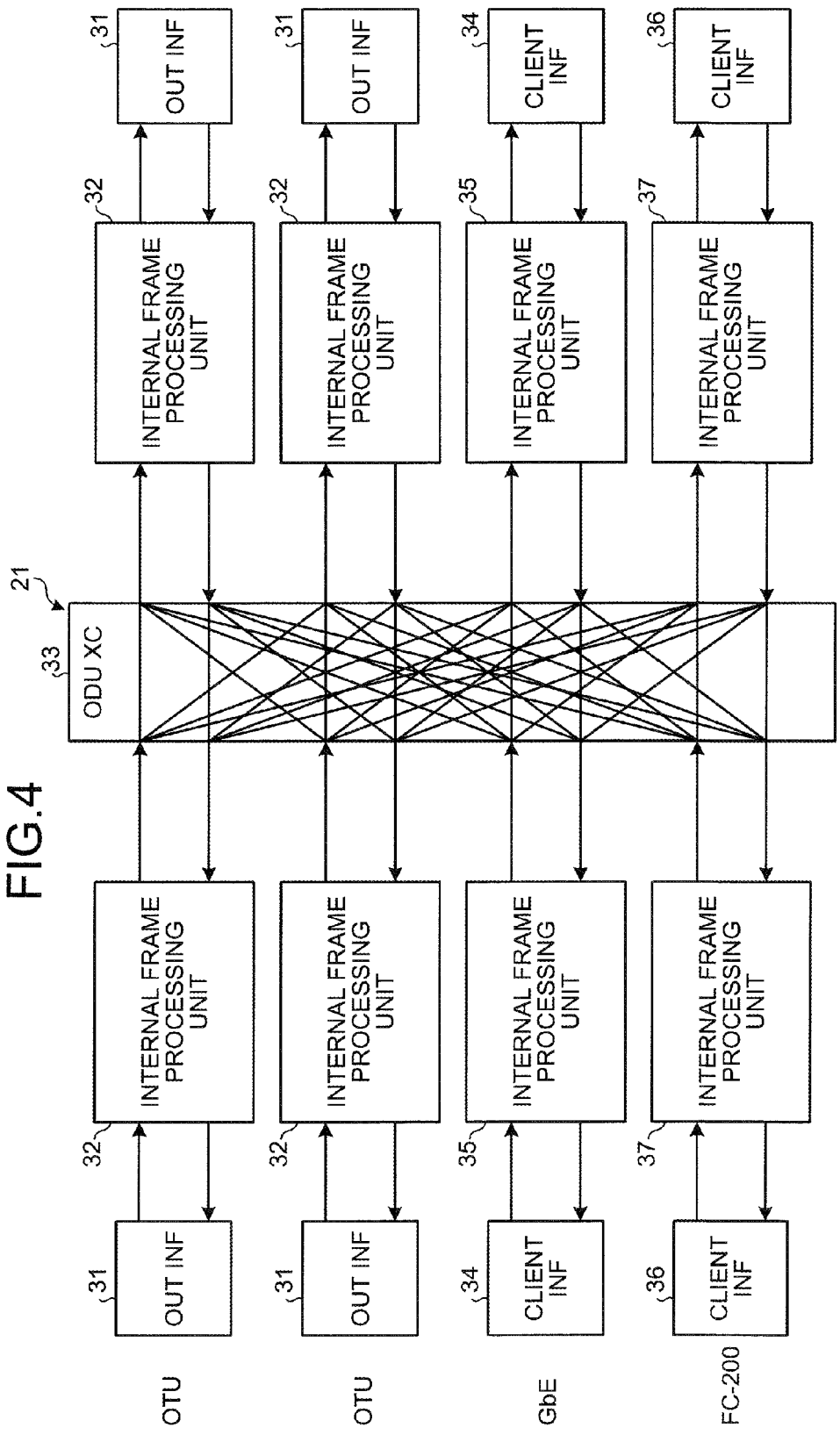
FIG. 4 is a block diagram of an entire ADM.

FIG. 4 is a block diagram of the entire ADM. As depicted in FIG. 4, the ADM 21 uses, for example, an OTU interface (OTU INF) 31 to receive a frame signal in an OTU format from the OTN network and uses an internal frame processing unit 32 to perform demultiplexing or deframing from an OTU frame to an internal frame signal in an ODU frame format. The internal frame signal in the ODU frame format is cross-connected by an ODU cross connect (ODU XC) unit 33. The ADM 21 uses the internal frame processing unit 32 to map the internal frame signal output from the ODU cross connect unit 33 to a frame signal in an OTU frame format. The frame signal in the OTU frame format is sent from the OTU interface 31 to the OTU network.

The ADM 21 uses, for example, a client interface 34 for an Ethernet network such as GbE to receive a frame signal in an Ethernet format from the Ethernet network and uses an internal frame processing unit 35 to perform mapping to an internal frame signal in the ODU frame format. The internal frame signal in the ODU frame format is cross-connected by the ODU cross connect unit 33. The ADM 21 uses the internal frame processing unit 35 to demap the internal frame signal output from the ODU cross connect unit 33 to a frame signal in the Ethernet format. The frame signal in the Ethernet format is sent to the Ethernet network from the client interface 34 for the Ethernet network.

The ADM 21 uses, for example, a client interface 36 for a SAN such as FC-200 to receive a frame signal in a SAN format from the SAN and uses an internal frame processing unit 37 to perform mapping to an internal frame signal in the ODU frame format. The internal frame signal in the ODU frame format is cross-connected by the ODU cross connect unit 33. The ADM 21 uses the internal frame processing unit 37 to demap the internal frame signal output from the ODU cross connect unit 33 to a frame signal in the SAN format. The frame signal in the SAN format is sent to the SAN from the client interface 36 for the SAN.

OTU is an abbreviation for Optical cannel Transport Unit. ODU is an abbreviation for Optical channel Data Unit. GbE is an abbreviation for Gigabit Ethernet. FC is an abbreviation for Fibre Channel. SAN is an abbreviation for Storage Area Network.

Figure 5:
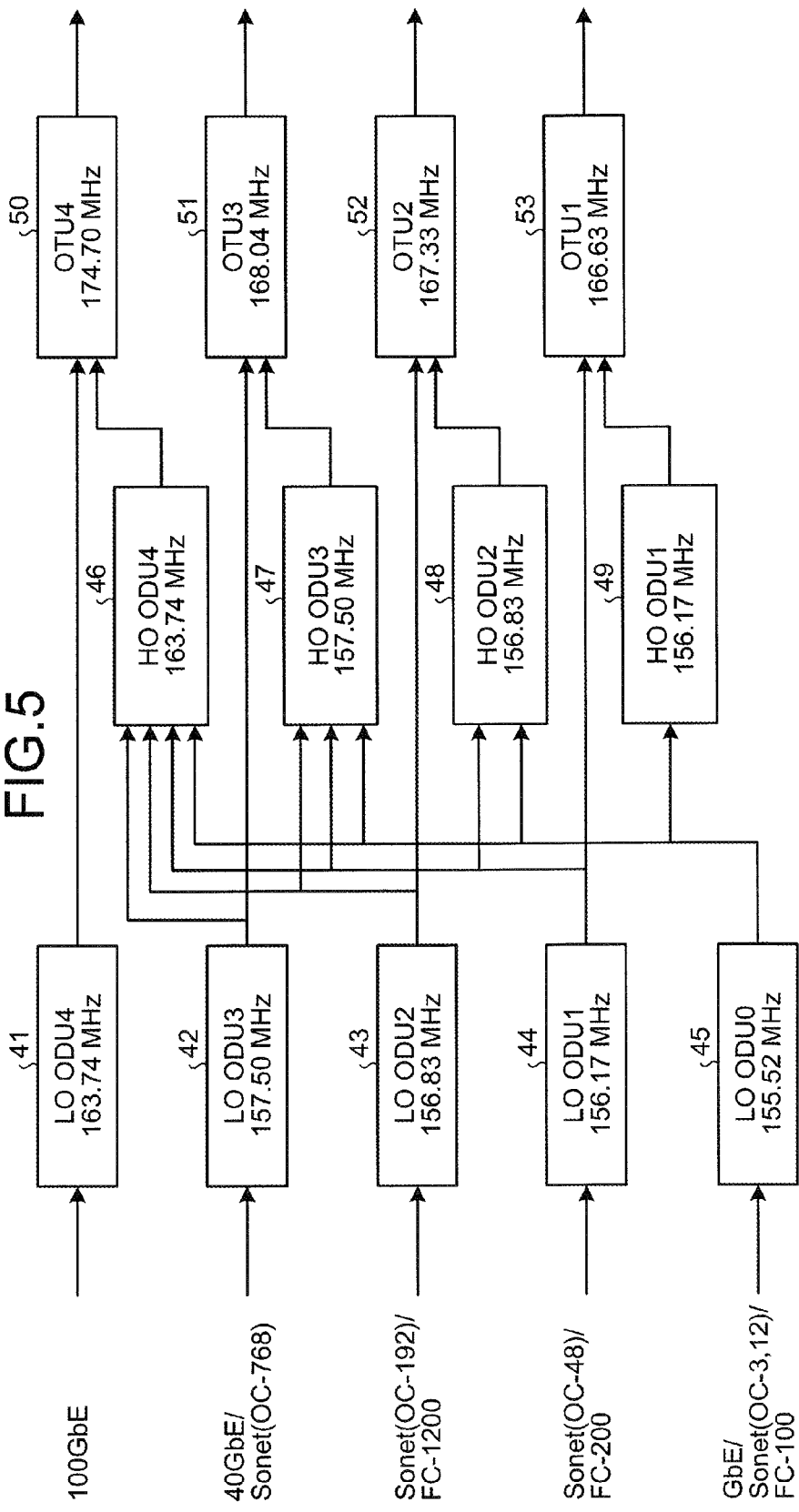
FIG. 5 is a schematic of an example of multiple steps of an OTN frame.

FIG. 5 is a schematic of an example of multiple steps of an OTN frame. As depicted in FIG. 5, the OTN has multiple steps of various client signals and different clock frequencies are necessary for respective frames.

For example, as indicted by reference numeral 41, a clock of 163.74 MHz is used for mapping a frame signal in the 100 GbE format to a frame signal in the LO ODU4 format. For example, as indicted by reference numeral 42, a clock of 157.50 MHz is used for mapping a frame signal in the 40 GbE or Sonet (OC-768) format to a frame signal in the LO ODU3 format. For example, as indicted by reference numeral 43, a clock of 156.83 MHz is used for mapping a frame signal in the Sonet (OC-192) or FC-1200 format to a frame signal in the LO ODU2 format. For example, as indicted by reference numeral 44, a clock of 156.17 MHz is used for mapping a frame signal in the Sonet (OC-48) or FC-200 format to a frame signal in the LO ODU1 format. For example, as indicted by reference numeral 45, a clock of 155.52 MHz is used for mapping a frame signal in the GbE, Sonet (OC-3, 12), or FC-100 format to a frame signal in the LO ODU0 format.

For example, as indicted by reference numeral 46, a clock of 163.74 MHz is used for mapping a frame signal in the LO ODU3, LO ODU2, LO ODU1, or LO ODU0 format to a frame signal in the HO ODU4 format. For example, as indicted by reference numeral 47, a clock of 157.50 MHz is used for mapping a frame signal in the LO ODU2, LO ODU1, or LO ODU0 format to a frame signal in the HO ODU3 format. For example, as indicted by reference numeral 48, a clock of 156.83 MHz is used for mapping a frame signal in the LO ODU1 or LO ODU0 format to a frame signal in the HO ODU2 format. For example, as indicted by reference numeral 49, a clock of 156.17 MHz is used for mapping a frame signal in the LO ODU0 format to a frame signal in the HO ODU1 format.

For example, as indicted by reference numeral 50, a clock of 174.70 MHz is used for mapping a frame signal in the LO ODU4 or HO ODU4 format to a frame signal in the OTU4 format. For example, as indicted by reference numeral 51, a clock of 168.04 MHz is used for mapping a frame signal in the LO ODU3 or HO ODU3 format to a frame signal in the OTU3 format. For example, as indicted by reference numeral 52, a clock of 167.33 MHz is used for mapping a frame signal in the LO ODU2 or HO ODU2 format to a frame signal in the OTU2 format. For example, as indicted by reference numeral 53, a clock of 166.63 MHz is used for mapping a frame signal in the LO ODU1 or HO ODU1 format to a frame signal in the OTU1 format.

Therefore, for example, in the example depicted in FIG. 5, nine clocks having different frequencies are used. For example, if crystal oscillators are used to implement the clock resources outputting the clocks of the various frequencies, increases in circuit scale, cost, and power consumption are disadvantageously caused. The frame signals sent to the OTN network are desirably synchronized with a clock having a duty ratio of 0.5. On the other hand the internal frame signals processed within the ADM 21 are not necessarily synchronized with a clock having a duty ratio of 0.5.

Therefore, the ADM 21 according to the embodiment generates clocks used in circuits processing the internal frame signals from a clock used for mapping an internal frame signal to a frame signal in an OTU format. Since this reduces the number of crystal oscillators, increases in circuit scale, cost, and power consumption can be suppressed.

LO ODU is an abbreviation for Lower Order ODU. HO ODU is an abbreviation for Higher Order ODU.

Figure 6:
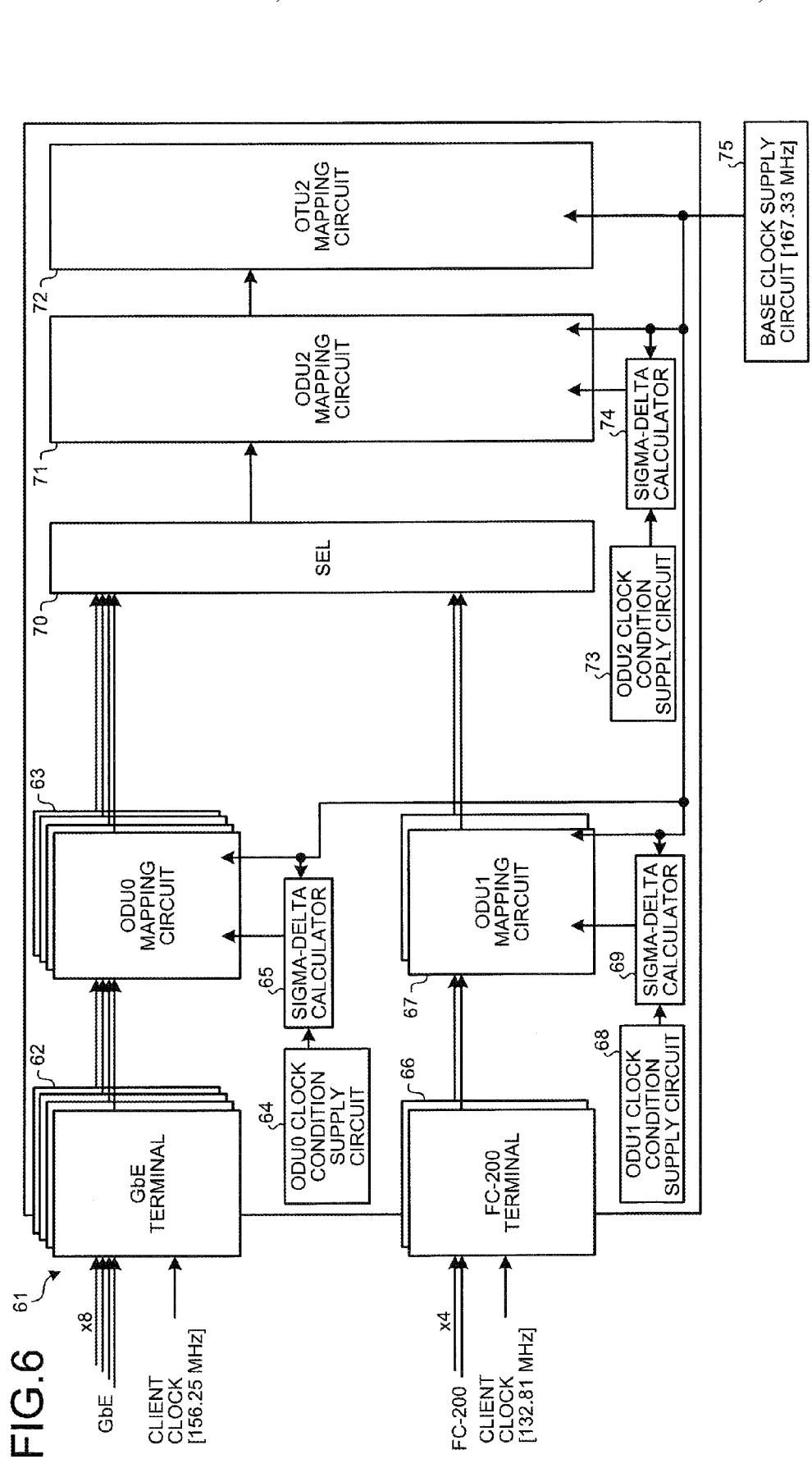
FIG. 6 is a block diagram of an example of the transmitting apparatus according to a second embodiment.

FIG. 6 is a block diagram of an example of the transmitting apparatus according to the second embodiment. The case of mapping a frame signal in the GbE format and a frame signal in the FC-200 format to a frame signal of the OTU2 format will be described as an example. Even if the formats of the frame signals before and after mapping are other than the GbE, FC-200, and OTU2 formats, the description is the same.

As depicted in FIG. 6, an ADM 61 is a transmitting apparatus according to the second embodiment and includes, for example, an ODU0 mapping circuit 63, an ODU1 mapping circuit 67, and an ODU2 mapping circuit 71 as a first frame processing circuit or a second frame processing circuit. The ADM 61 includes, for example, sigma-delta calculators 65, 69, and 74 as a first circuit or a second circuit.

The ADM 61 includes a GbE terminal 62, an FC-200 terminal 66, an ODU0 clock condition supply circuit 64, an ODU1 clock condition supply circuit 68, an ODU2 clock condition supply circuit 73, a selector (SEL) 70, and an OTU2 mapping circuit 72. The ADM 61 includes a base clock supply circuit 75. The base clock supply circuit 75 includes a crystal oscillator, for example, and outputs a base clock having a frequency of 167.33 MHz, for example.

The GbE terminal 62 is connected to an Ethernet network not depicted. The GbE terminal 62 is a client interface for the Ethernet network. The GbE terminal 62 receives a frame signal in the Ethernet format from the Ethernet network and outputs a frame signal in the Ethernet format synchronized with a client clock having a frequency of 156.25 MHz, for example.

The ODU0 mapping circuit 63 is connected to the GbE terminal 62, the sigma-delta calculator 65, and the base clock supply circuit 75. The ODU0 mapping circuit 63 maps the frame signal in the Ethernet format output from the GbE terminal 62 to an intermediate frame signal in the ODU0 format. The ODU0 mapping circuit 63 outputs the intermediate frame signal in the ODU0 format synchronized with an enable signal output from, for example, the sigma-delta calculator 65 based on a base clock output from the base clock supply circuit 75.

The ODU0 clock condition supply circuit 64 outputs an ODU0 clock condition. The sigma-delta calculator 65 is connected to the ODU0 clock condition supply circuit 64 and the base clock supply circuit 75. The sigma-delta calculator 65 drops pulses from the base clock output from the base clock supply circuit 75 based on the ODU0 clock condition given from the ODU0 clock condition supply circuit 64 and thereby, generates the enable signal having a frequency of 155.52 MHz, for example.

The FC-200 terminal 66 is connected to a SAN, not depicted. The FC-200 terminal 66 is a client interface for the SAN. The FC-200 terminal 66 receives a frame signal in the SAN format from the SAN and outputs a frame signal in the SAN format synchronized with a client clock having a frequency of 132.81 MHz, for example.

The ODU1 mapping circuit 67 is connected to the FC-200 terminal 66, the sigma-delta calculator 69, and the base clock supply circuit 75. The ODU1 mapping circuit 67 maps to an intermediate frame signal in the ODU1 format, the frame signal that is in the SAN format and output from the FC-200 terminal 66. The ODU1 mapping circuit 67 outputs the intermediate frame signal in the ODU1 format synchronized with an enable signal output from, for example, the sigma-delta calculator 69 based on the base clock output from the base clock supply circuit 75.

The ODU1 clock condition supply circuit 68 outputs an ODU1 clock condition. The sigma-delta calculator 69 is connected to the ODU1 clock condition supply circuit 68 and the base clock supply circuit 75. The sigma-delta calculator 69 drops pulses from the base clock output from the base clock supply circuit 75 based on the ODU1 clock condition given from the ODU1 clock condition supply circuit 68 and thereby, generates the enable signal having a frequency of 156.17 MHz, for example.

The selector 70 is connected to the ODU0 mapping circuit 63 and the ODU1 mapping circuit 67. The selector 70 selects and outputs one of the intermediate frame signal in the ODU0 format output from the ODU0 mapping circuit 63 and the intermediate frame signal in the ODU1 format output from the ODU1 mapping circuit 67 based on a control signal output from a control circuit not depicted.

The ODU2 mapping circuit 71 is connected to the selector 70, the sigma-delta calculator 74, and the base clock supply circuit 75. The ODU2 mapping circuit 71 maps the output signal of the selector 70 to an intermediate frame signal in the ODU2 format. The ODU2 mapping circuit 71 outputs the intermediate frame signal in the ODU2 format synchronized with an enable signal output from, for example, the sigma-delta calculator 74 based on the base clock output from the base clock supply circuit 75.

The ODU2 clock condition supply circuit 73 outputs an ODU2 clock condition. The sigma-delta calculator 74 is connected to the ODU2 clock condition supply circuit 73 and the base clock supply circuit 75. The sigma-delta calculator 74 drops pulses from the base clock output from the base clock supply circuit 75 based on the ODU2 clock condition given from the ODU2 clock condition supply circuit 73 and thereby, generates the enable signal having a frequency of 156.83 MHz, for example.

The OTU2 mapping circuit 72 is connected to the ODU2 mapping circuit 71 and the base clock supply circuit 75. The OTU2 mapping circuit 72 maps the intermediate frame signal in the ODU2 format output from the ODU2 mapping circuit 71 to a transmission frame signal in the OTU2 format. The OTU2 mapping circuit 72 outputs the transmission frame signal in the OTU2 format, synchronized with the base clock output from the base clock supply circuit 75 to an OTN network not depicted, for example.

Figure 7:
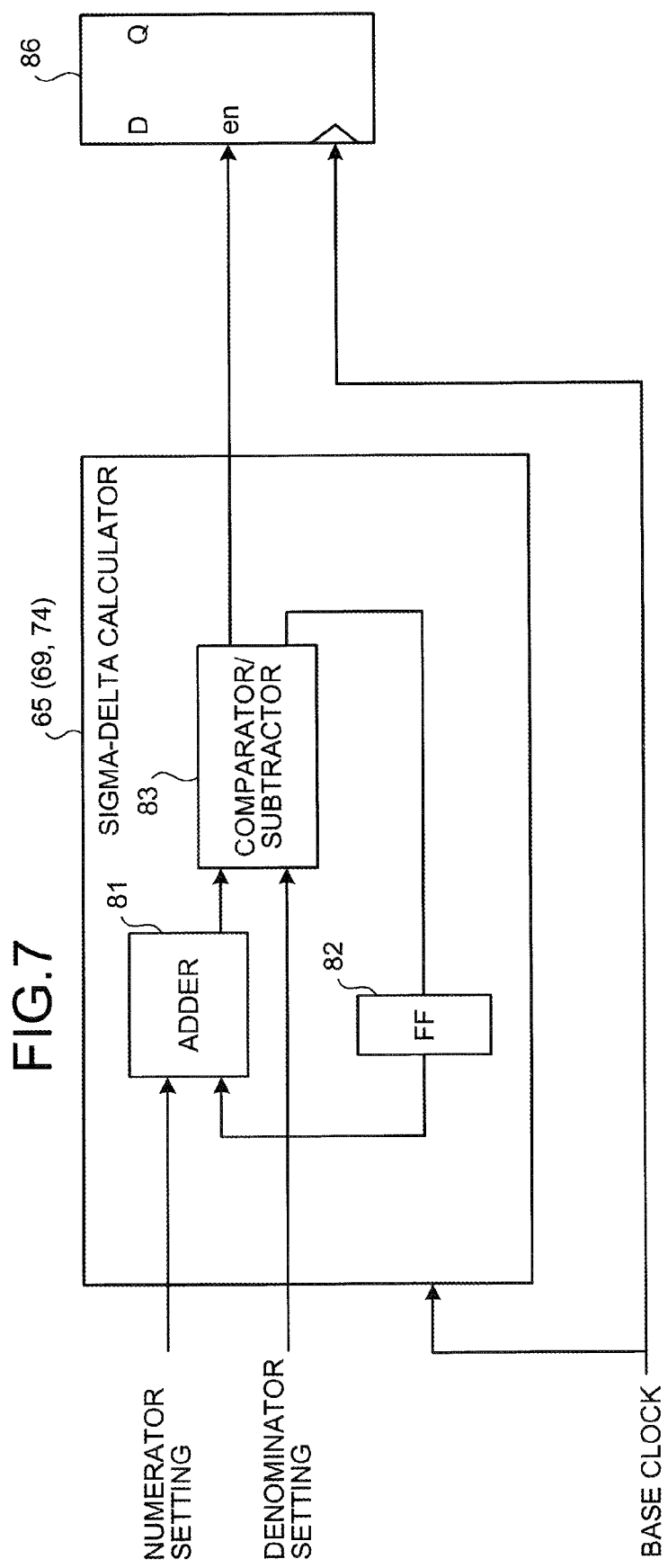
FIG. 7 is a block diagram of a sigma-delta calculator of the transmitting apparatus depicted in FIG. 6.

FIG. 7 is a block diagram of the sigma-delta calculator of the transmitting apparatus depicted in FIG. 6. The sigma-delta calculator 65 includes an adder 81, a flip-flop (FF) 82, and a comparator/subtractor 83. The sigma-delta calculator 65 operates synchronized with the base clock.

The adder 81 adds a numerator setting value to an output value of the flip-flop (FF) 82. If the output value of the adder 81 is equal to or greater than a denominator setting value, the comparator/subtractor 83 outputs one as the enable signal and outputs to the flip-flop 82, a value obtained by subtracting the denominator setting value from the output value of the adder 81. On the other hand, if the output value of the adder 81 is less than the denominator setting value, the comparator/subtractor 83 outputs zero as the enable signal and outputs the output value of the adder 81 directly to the flip-flop 82. The flip-flop 82 retains the output value of the comparator/subtractor 83 and outputs the retained value to the adder 81. The numerator setting value is equal to or less than the denominator setting value.

In FIG. 7, a flip-flop 86 disposed downstream from the sigma-delta calculator 65 is disposed on the ODU0 mapping circuit 63, for example, and outputs an input value to a D-terminal from a Q-terminal based on the base clock and the enable signal output from the sigma-delta calculator 65.

Figure 8:
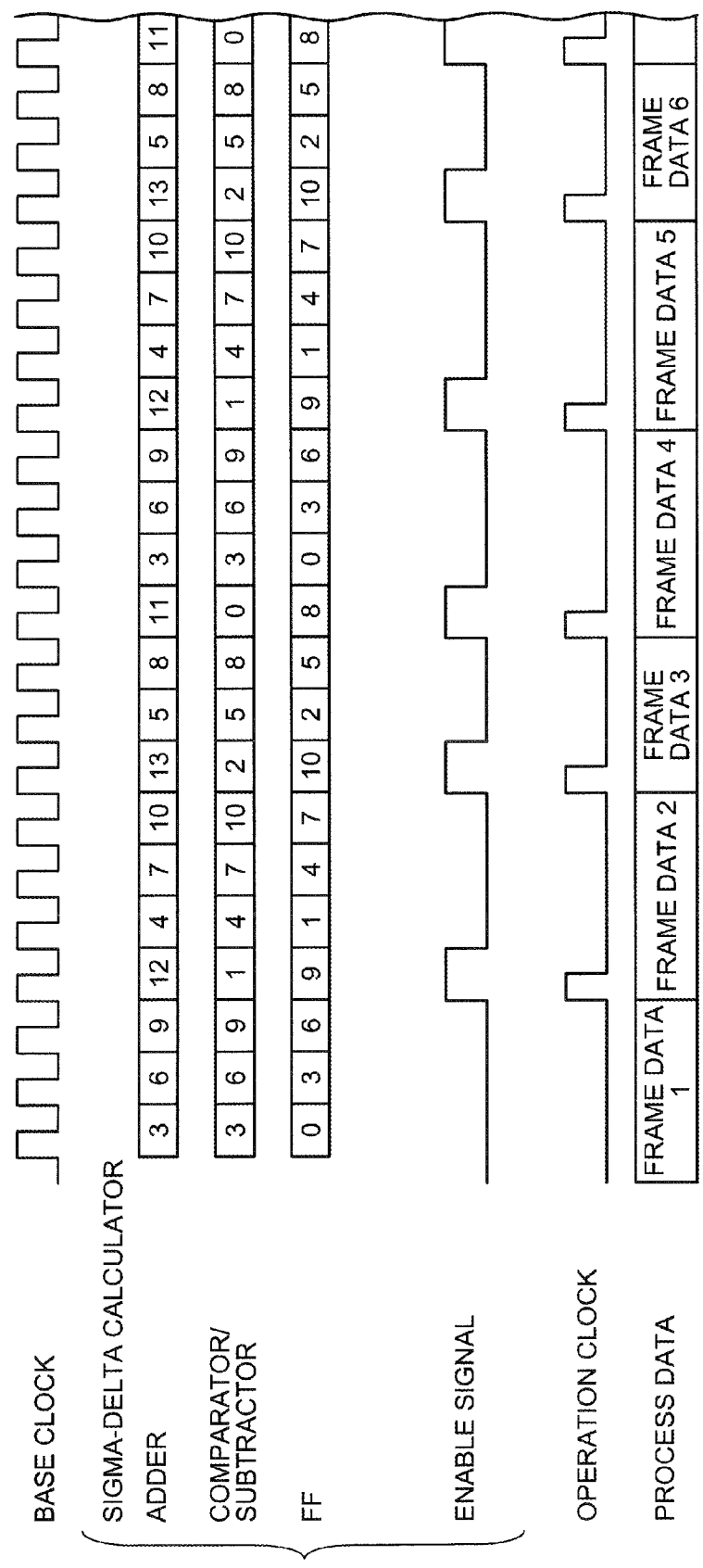
FIG. 8 is a timing chart of the operation of the sigma-delta calculator depicted in FIG. 7.

FIG. 8 is a timing chart of the operation of the sigma-delta calculator depicted in FIG. 7. As one example, the numerator setting value is 3 and the denominator setting value is 11 in this description. In this case, the denominator setting value is represented by four bits.

As depicted in FIG. 8, Since the numerator setting value is 3, the output value of the adder 81 changes to 3, 6, 9, 12, 4, 7, 10, 13, 5, 8, and 11, which are subsequently repeated. Since the denominator setting value is 11, the value of the enable signal turns to one when the output value of the adder 81 is 12, 13, or 11, and turns to zero in the case of the other values. Therefore, while the output value of the adder 81 cycles once, i.e., during 11 pulses of the base clock, the value of the enable signal turns to one thrice.

Therefore, the sigma-delta calculator 65 can acquire the enable signal having a frequency that is 3/11 of the frequency of the base clock with eight pulses evenly missed in the base clock. In FIG. 8, an operation clock turns to one when both the base clock and the enable signal are one, and turns to zero in the other cases. A circuit supplied with the base clock and the enable signal operates with a signal depicted as the operation clock in FIG. 8. Frame data output by the flip-flop 86 downstream from the sigma-delta calculator 65 switches synchronized with the rising edge of the operation clock. The denominator setting value may be represented by 20 bits, for example. As a result, the frequency of the enable signal can be set within a range of ±1 ppm.

The same applies to the sigma-delta calculator 69 and the sigma-delta calculator 74. In FIG. 7, the flip-flop 86 is disposed on the ODU1 mapping circuit 67 in the case of the sigma-delta calculator 69, and the flip-flop 86 is disposed on the ODU2 mapping circuit 71 in the case of the sigma-delta calculator 74.

The numerator setting value and the denominator setting value for the sigma-delta calculator 65 are provided from the ODU0 clock condition supply circuit 64. Therefore, the ODU0 clock condition supply circuit 64 supplies the numerator setting value and the denominator setting value to the sigma-delta calculator 65. For example, if the frequency of the base clock is 167.33 MHz and the frequency of the enable signal output from the sigma-delta calculator 65 is 155.52 MHz, the numerator setting value may be 237 and the denominator setting value may be 255. The denominator setting value in the sigma-delta calculator 65 may be changed dynamically under the control of software, for example.

The numerator setting value and the denominator setting value for the sigma-delta calculator 69 are provided from the ODU1 clock condition supply circuit 68. Therefore, the ODU1 clock condition supply circuit 68 supplies the numerator setting value and the denominator setting value to the sigma-delta calculator 69. For example, if the frequency of the base clock is 167.33 MHz and the frequency of the enable signal output from the sigma-delta calculator 69 is 156.17 MHz, the numerator setting value may be 56643 and the denominator setting value may be 60690. The denominator setting value in the sigma-delta calculator 69 may be changed dynamically under the control of software, for example.

The numerator setting value and the denominator setting value for the sigma-delta calculator 74 are provided from the ODU2 clock condition supply circuit 73. Therefore, the ODU2 clock condition supply circuit 73 supplies the numerator setting value and the denominator setting value to the sigma-delta calculator 74. For example, if the frequency of the base clock is 167.33 MHz and the frequency of the enable signal output from the sigma-delta calculator 74 is 156.83 MHz, the numerator setting value may be 239 and the denominator setting value may be 255. The denominator setting value in the sigma-delta calculator 74 may be changed dynamically under the control of software, for example.

In the ADM 61 depicted in FIG. 6, a prime-delta calculator may be used instead of the sigma-delta calculators 65, 69, and 74.

Figure 9:
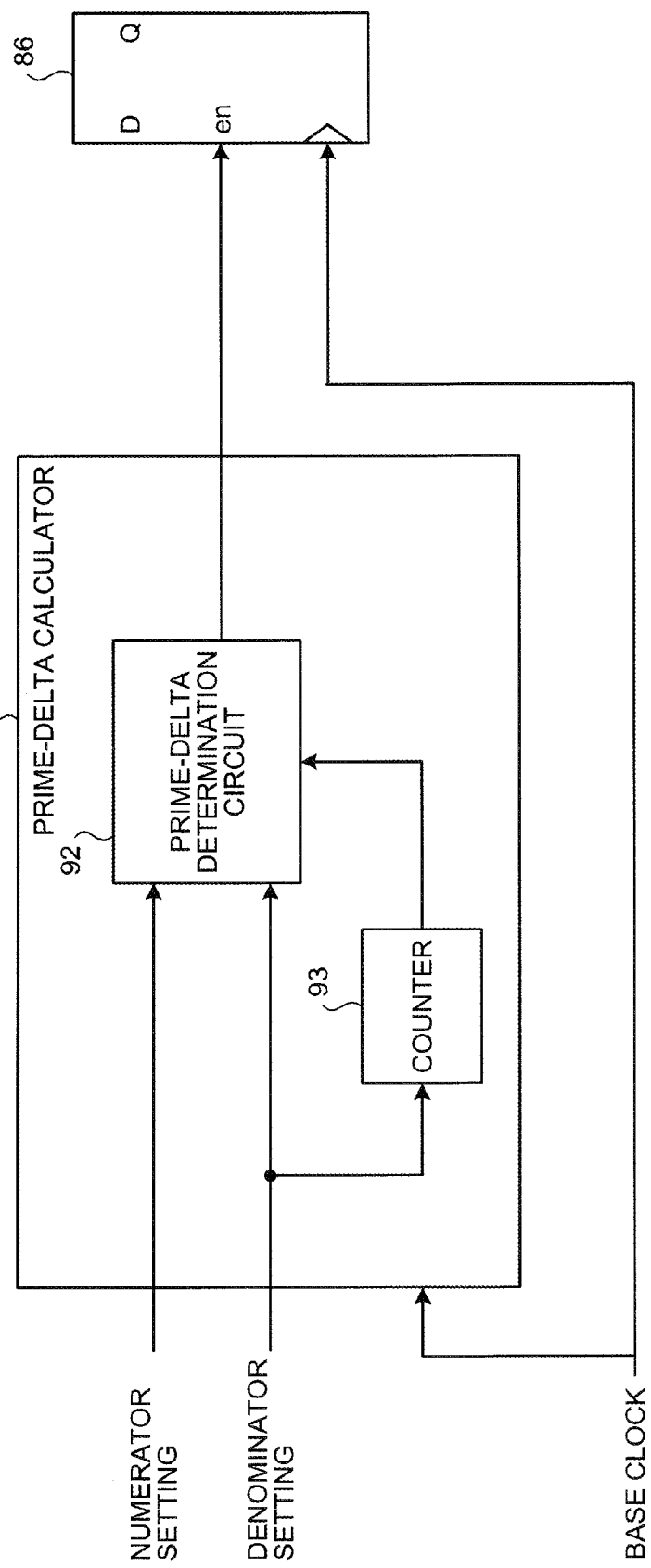
FIG. 9 is a block diagram of a prime-delta calculator.

FIG. 9 is a block diagram of a prime-delta calculator. A prime-delta calculator 91 includes a prime-delta determination circuit 92 and a counter 93. The prime-delta calculator 91 operates synchronized with the base clock.

The counter 93 usually retains a value with a fixed value added. However, if a value with a fixed value added is equal to or greater than the denominator setting value, the counter 93 retains a value acquired by subtracting the denominator setting value from the value with a fixed value added. If the output value of the counter 93 is less than the numerator setting value, the prime-delta determination circuit 92 outputs one as the enable signal. On the other hand, if the output value of the counter 93 is equal to or greater than the numerator setting value, the prime-delta determination circuit 92 outputs zero as the enable signal. The numerator setting value is equal to or less than the denominator setting value. In FIG. 9, the flip-flop 86 disposed downstream from the prime-delta calculator 91 is disposed on the ODU0 mapping circuit 63, the ODU1 mapping circuit 67, or the ODU2 mapping circuit 71, for example, and outputs an input value to the D-terminal from the Q-terminal based on the base clock and the enable signal output from the prime-delta calculator 91.

Figure 10:
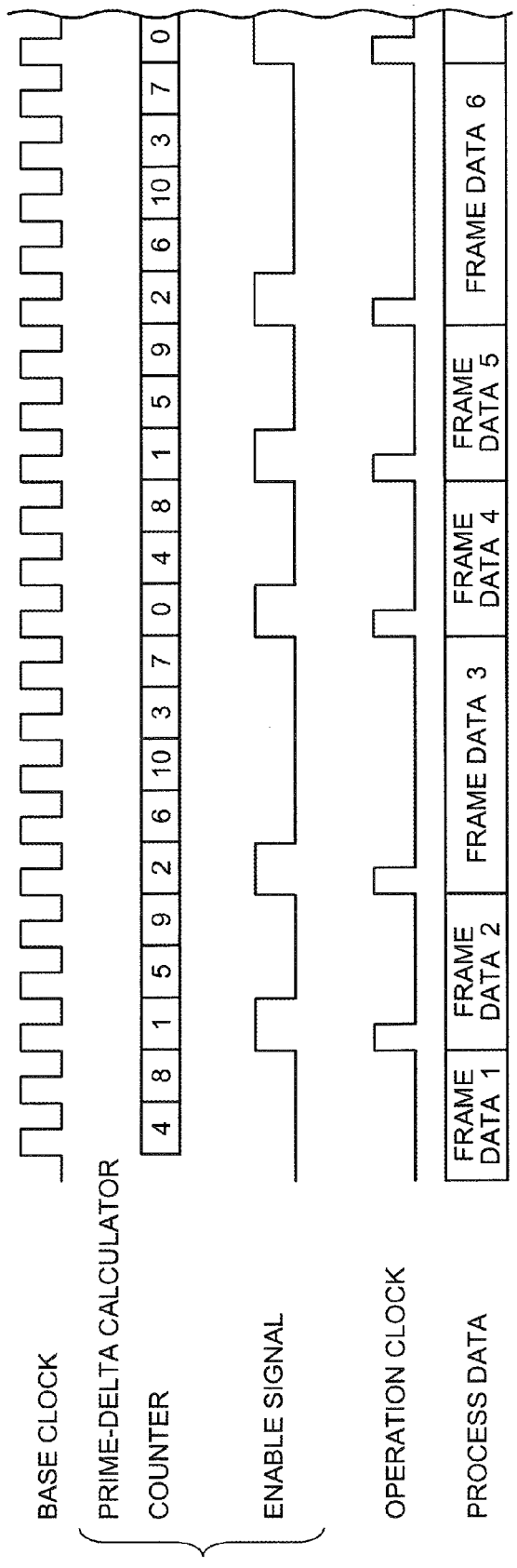
FIG. 10 is a timing chart of the operation of the prime-delta calculator depicted in FIG. 9.

FIG. 10 is a timing chart of the operation of the prime-delta calculator depicted in FIG. 9. As one example, the numerator setting value is 3; the denominator setting value is 11; and the fixed value added by the counter 93 is 4 in this description. In this case, the denominator setting value is represented by four bits.

As depicted in FIG. 10, Since the fixed value added by the counter 93 is 4, the output value of the counter 93 changes to 4, 8, 1, 5, 9, 2, 6, 10, 3, 7, and 0, which are subsequently repeated. Since the numerator setting value is 3, the value of the enable signal turns to one when the output value of the counter 93 is 1, 2, or 0, and turns to zero in the case of the other values. Therefore, while the output value of the counter 93 cycles once, i.e., during 11 pulses of the base clock, the value of the enable signal turns to one thrice.

Therefore, the prime-delta calculator 91 can acquire the enable signal having a frequency that is 3/11 of the frequency of the base clock with eight pulses evenly missed in the base clock. In FIG. 10, an operation clock turns to one when both the base clock and the enable signal are one, and turns to zero in the other cases. A circuit supplied with the base clock and the enable signal operates with a signal depicted as the operation clock in FIG. 10. Frame data output by the flip-flop 86 downstream from the prime-delta calculator 91 switches synchronized with the rising edge of the operation clock. The denominator setting value can be represented by, for example, 20 bits to set the frequency of the enable signal within a range of ±1 ppm.

Figure 11:
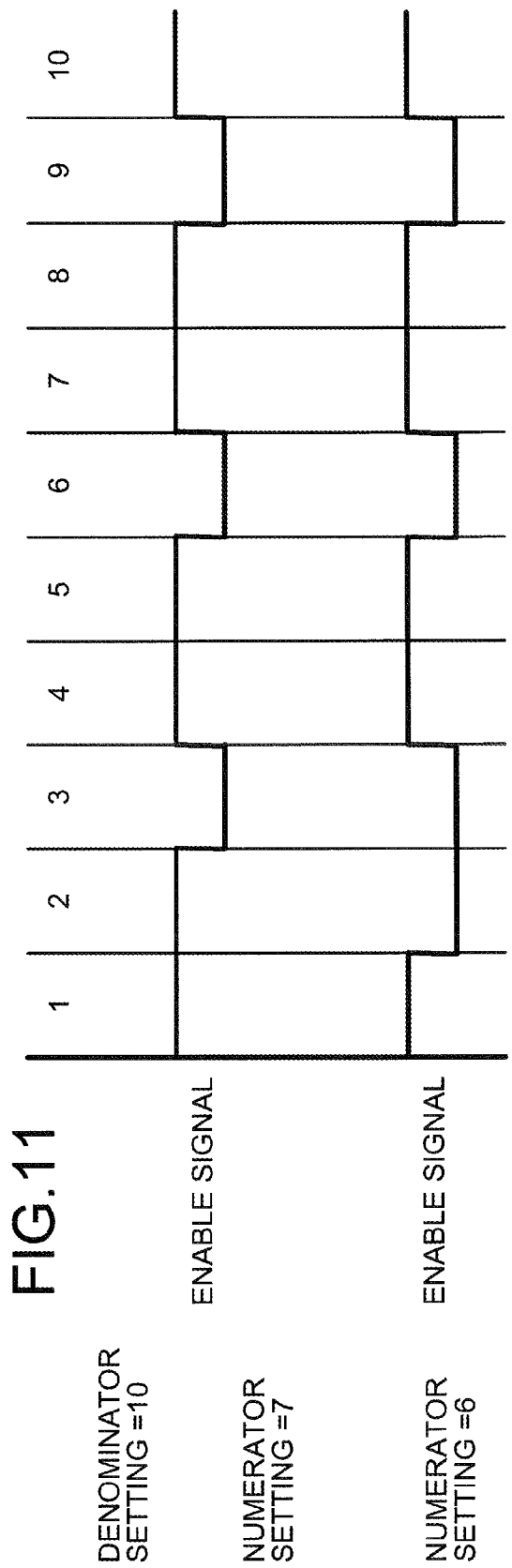
FIG. 11 is a timing chart of the enable signal output from the prime-delta calculator.

FIG. 11 is a timing chart of the enable signal output from the prime-delta calculator. As depicted in FIG. 11, for example, when the numerator setting value is changed by one from 6 to 7, the value of the enable signal is changed at one position.

If the prime-delta calculator 91 is used instead of the sigma-delta calculator 65, the numerator setting value and the denominator setting value for the prime-delta calculator 91 are given from the ODU0 clock condition supply circuit 64. For example, if the frequency of the base clock is 167.33 MHz and the frequency of the enable signal output from the prime-delta calculator 91 is 155.52 MHz, the numerator setting value may be 237 and the denominator setting value may be 255.

If the prime-delta calculator 91 is used instead of the sigma-delta calculator 69, the numerator setting value and the denominator setting value for the prime-delta calculator 91 are given from the ODU1 clock condition supply circuit 68. For example, if the frequency of the base clock is 167.33 MHz and the frequency of the enable signal output from the prime-delta calculator 91 is 156.17 MHz, the numerator setting value may be 56643 and the denominator setting value may be 60690.

If the prime-delta calculator 91 is used instead of the sigma-delta calculator 74, the numerator setting value and the denominator setting value for the prime-delta calculator 91 are given from the ODU2 clock condition supply circuit 73. For example, if the frequency of the base clock is 167.33 MHz and the frequency of the enable signal output from the prime-delta calculator 91 is 156.83 MHz, the numerator setting value may be 239 and the denominator setting value may be 255.

In the ADM 61 depicted in FIG. 6, the ODU0 mapping circuit 63, the ODU1 mapping circuit 67, or the ODU2 mapping circuit 71, the OTU2 mapping circuit 72, and the sigma-delta calculators 65, 69, and 74 operate synchronized with the base clock. Therefore, for example, the ODU0 mapping circuit 63 operates at a frequency different from the ODU1 mapping circuit 67; however, the process of the ODU0 mapping circuit 63 and the process of the ODU1 mapping circuit 67 can be time-multiplexed.

Figure 12:
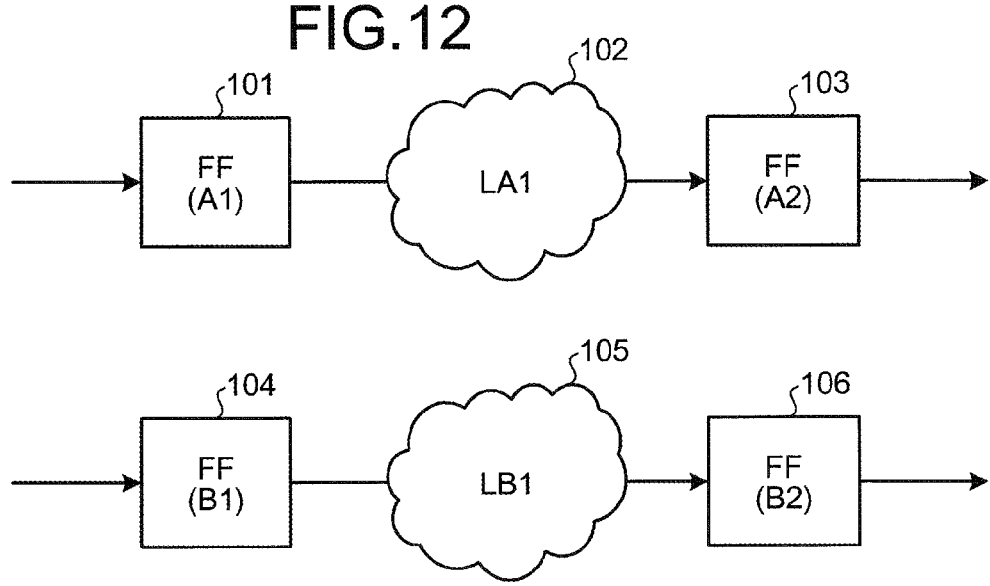
FIG. 12 is a schematic of an example of a circuit that does not multiplex processes of different frequencies.

FIG. 12 is a schematic of an example of a circuit that does not multiplex processes of different frequencies. FIG. 13 is a timing chart of the operation of the circuit depicted in FIG. 12. As depicted in FIG. 12, although a process system of an FF (A1) 101, an LA1 logic 102, and an FF (A2) 103 is synchronized with a process system of an FF (B1) 104, an LB1 logic 105, and an FF (B2) 106, the processes have frequencies different from each other. If the two process systems are not multiplexed, the LA1 logic 102 and the LB1 logic 105 are necessary for the respective process systems. The timing chart in this case is as depicted in FIG. 13.

Figure 14:
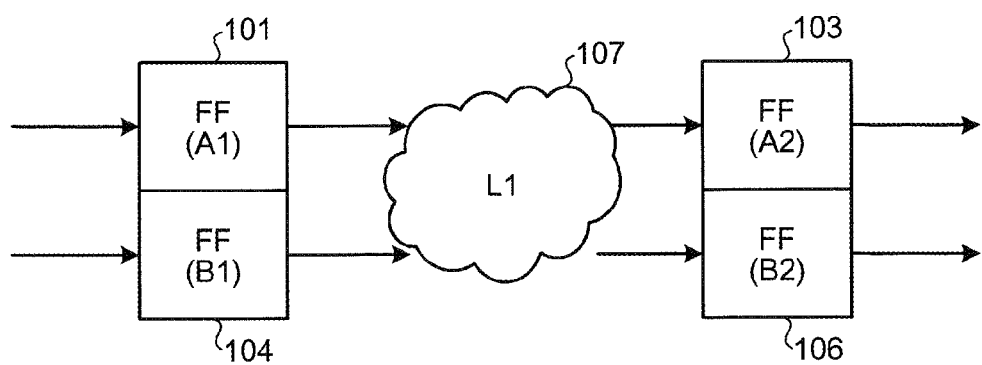
FIG. 14 is a diagram of an example of a circuit that multiplexes processes of different frequencies.
Figure 15:
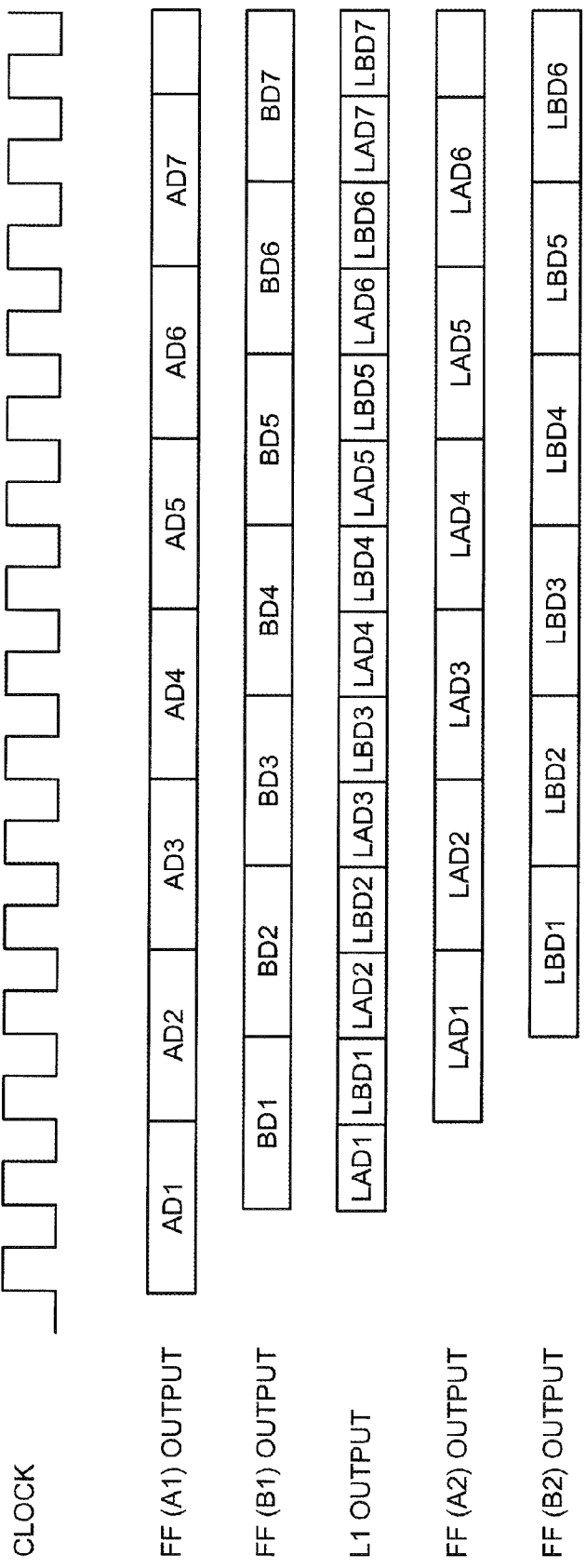
FIG. 15 is a timing chart of the operation of the circuit depicted in FIG. 14.

FIG. 14 is a diagram of an example of a circuit that multiplexes processes of different frequencies. FIG. 15 is a timing chart of the operation of the circuit depicted in FIG. 14. As depicted in FIG. 14, when two synchronized process systems are multiplexed, the two process systems need only one common L1 logic 107. In this case, as depicted in FIG. 15, the common L1 logic 107 executes processes in a time-multiplexed manner in the two process systems.

Figure 16:
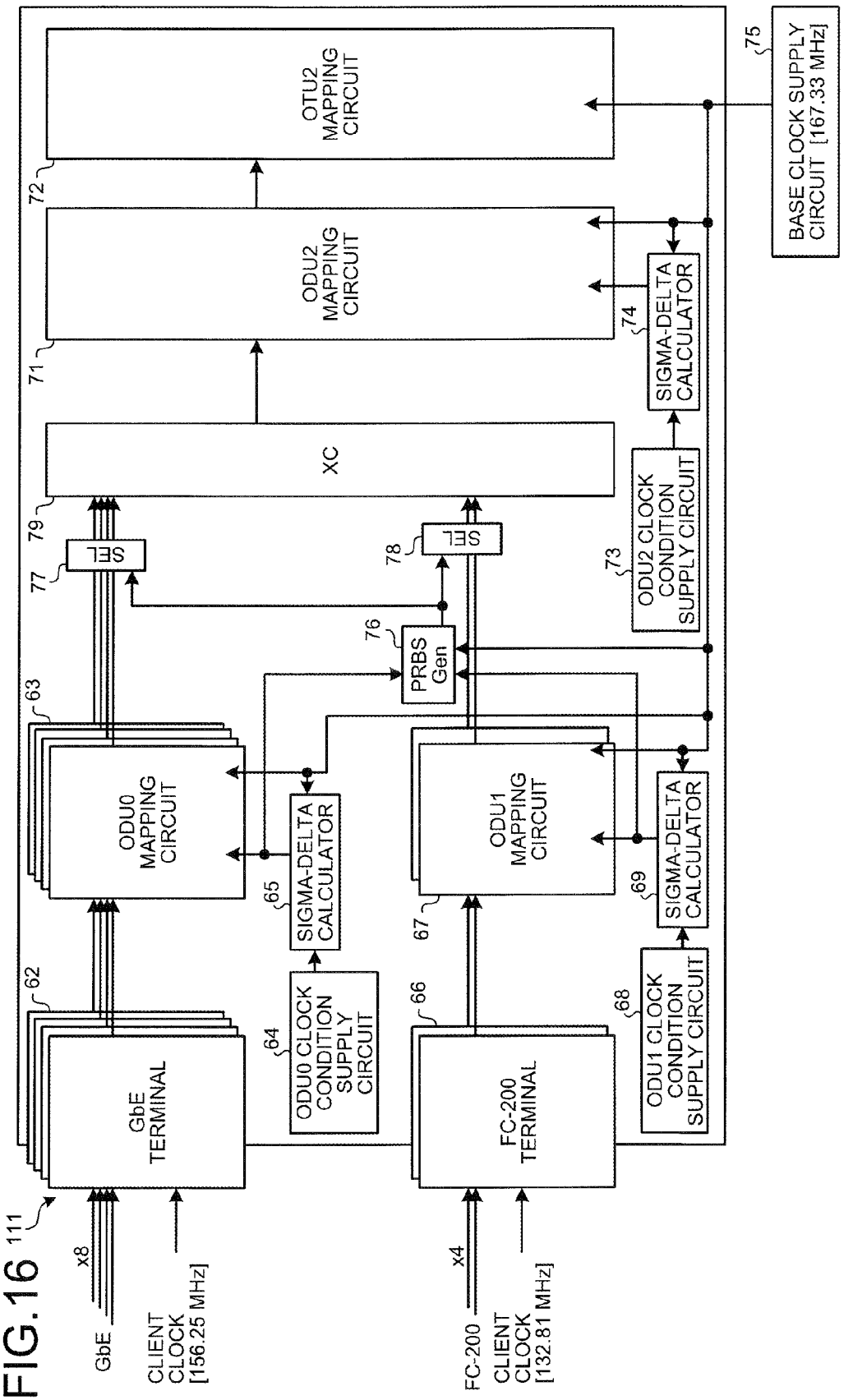
FIG. 16 is a block diagram of another example of the transmitting apparatus according to the second embodiment.

FIG. 16 is a block diagram of another example of the transmitting apparatus according to the second embodiment. An ADM 111 depicted in FIG. 16 has, for example, a pseudorandom bit generator (PRBS Gen) 76 as a third circuit in addition to the configuration of the ADM 61 depicted in FIG. 6. The ADM 111 has selectors (SEL) 77 and 78. A cross connect (XC) 79 is used instead of the selector 70 of the ADM 61 depicted in FIG. 6. A selector may obviously be used instead of the cross connect 79.

The pseudorandom bit generator 76 is connected to the sigma-delta calculator 65, the sigma-delta calculator 66, and the base clock supply circuit 75. The pseudorandom bit generator 76 outputs a pseudorandom bit synchronized with the enable signal output from, for example, the sigma-delta calculator 65 based on the base clock output from the base clock supply circuit 75.

The pseudorandom bit generator 76 outputs a pseudorandom bit synchronized with the enable signal output from, for example, the sigma-delta calculator 69 based on the base clock. The pseudorandom bit generator 76 outputs the pseudorandom bit synchronized with the enable signal output from the sigma-delta calculator 65 and the pseudorandom bit synchronized with the enable signal output from the sigma-delta calculator 69 in a time-multiplexed manner (see FIG. 14).

The selector 77 is connected to the ODU0 mapping circuit 63 and the pseudorandom bit generator 76. The selector 77 selects and outputs one among the intermediate frame signal output from the ODU0 mapping circuit 63 and the pseudorandom bit output from the pseudorandom bit generator 76, based on a control signal output from the control circuit not depicted.

The selector 78 is connected to the ODU1 mapping circuit 67 and the pseudorandom bit generator 76. The selector 78 selects and outputs one among the intermediate frame signal output from the ODU1 mapping circuit 67 and the pseudorandom bit output from the pseudorandom bit generator 76, based on a control signal output from the control circuit not depicted. For example, if a continuity test is conducted at the time of installation or maintenance of the ADM 111, the selector 77 may select the output signal (pseudorandom bit) of the pseudorandom bit generator 76.

For example, if a continuity test is conducted at the time of installation or maintenance of the ADM 111, the selector 77 and the selector 78 may select the output signal (pseudorandom bit) of the pseudorandom bit generator 76. The cross connect 79 is connected to the selector 77 and the selector 78. The cross connect 79 selects and outputs one among the output signal from the selector 77 and the output signal from the selector 78, based on a control signal output from the control circuit not depicted.

In the example depicted in FIG. 16, the pseudorandom bit generator 76 is common to the ODU0 mapping circuit 63 and the ODU1 mapping circuit 67 and executes processes in a time-multiplexed manner. The mapping circuits 63 and 67 may be configured to have respective pseudorandom bit generators such that the pseudorandom bit generators output pseudorandom bits suitable for the respective mapping circuits 63 and 67. In this case, assuming that the number of ports of the ODU0 mapping circuit 63 is eight and that the number of ports of the ODU1 mapping circuit 67 is four, a total of 12 pseudorandom bit generators are needed. The cross connect 79 is connected to the ODU0 mapping circuit 63 and the ODU1 mapping circuit 67. The cross connect 79 selects and outputs one among the intermediate frame signal in the ODU0 format output from the ODU0 mapping circuit 63 and the intermediate frame signal in the ODU1 format output from the ODU1 mapping circuit 67, based on a control signal output from the control circuit, not depicted. Configuration may be such that the process of the ODU0 mapping circuit 63 is not time-multiplexed with the process of the ODU1 mapping circuit 67.

According to the second embodiment, the enable signal generated from the base clock can be used for operating the ODU0 mapping circuit 63, the ODU1 mapping circuit 67, and the ODU2 mapping circuit 71 based on the base clock. Therefore, signals having different frequencies can be processed based on the base clock. As a result, the number of crystal oscillators can be reduced, thereby suppressing increases in circuit scale, cost, and power consumption. The circuit scale can further be reduced by commonizing the synchronized circuits and by time-multiplexing the processes having the common circuit.

The ADMs 61 and 111 according to the second embodiment are applicable not only to a transmitting apparatus of an OTN system but also to a transmitting apparatus of an Ethernet system, a Sonet/SDH system, and an FC system to produce the same effect. The present invention is applicable not only to an ADM but also to a transmitting apparatus using multiple clocks to process signals to produce the same effect.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transmitting apparatus comprising:
    a first circuit to which a base clock and a first clock condition are input, the first circuit outputting a first enable signal based on the base clock and the first clock condition;
    a second circuit to which the base clock and a second clock condition are input, the second circuit outputting a second enable signal based on the base clock and the second clock condition;
    a first frame processing circuit receiving a first frame input signal and the first enable signal to output a first frame output signal in synchronization with the first enable signal; and
    a second frame processing circuit receiving a second frame input signal and the second enable signal to output a second frame output signal in synchronization with the second enable signal; and
    a pseudorandom bit generator receiving the first enable signal and the second enable signal, to output a pseudorandom bit synchronized with the first enable signal and a pseudorandom bit synchronized with the second enable signal in a time-multiplexed manner.

2. The transmitting apparatus according to claim 1, wherein the first circuit outputs the first enable signal in synchronization with the base clock, and
    the second circuit outputs the second enable signal in synchronization with the base clock.

3. The transmitting apparatus according to claim 1, wherein
    the first circuit drops pulses from the base clock based on the first clock condition and thereby, generates the first enable signal, and wherein
    the second circuit drops pulses from the base clock based on the second clock condition and thereby, generates the second enable signal.

4. The transmitting apparatus according to claim 1, wherein the first frame processing circuit and the second frame processing circuit operate in a time-multiplexed manner.

5. The transmitting apparatus according to claim 1, wherein the first circuit or the second circuit is a circuit performing a sigma-delta calculation.

6. The transmitting apparatus according to claim 1, wherein the first circuit or the second circuit is a circuit performing a smoothing operation other than a sigma-delta calculation.

7. A transmitting method comprising:
    outputting a first enable signal, based on a base clock and a first clock condition;
    receiving a first frame input signal and the first enable signal, to output a first frame output signal in synchronization with the first enable signal;
    outputting a second enable signal, based on the base clock and a second clock condition; and
    receiving a second frame input signal and the second enable signal, to output a second frame output signal in synchronization with the second enable signal; and
    receiving the first enable signal and the second enable signal by a pseudorandom bit generator, to output a pseudorandom bit synchronized with the first enable signal and a pseudorandom bit synchronized with the second enable signal in a time-multiplexed manner.

8. The transmitting method according to claim 7, wherein the first enable signal and the second enable signal are synchronized with the base clock.

9. The transmitting method according to claim 7, comprising:
- generating the first enable signal by dropping pulses from the base clock, based on the first clock condition, and
- generating the second enable signal by dropping pulses from the base clock, based on the second clock condition.

10. The transmitting method according to claim 7, wherein the outputting of the first frame output signal and the outputting of the second frame output signal are time-multiplexed.

11. The transmitting method according to claim 7, wherein the generating of the first enable signal or the generating of the second enable signal is performed by a sigma-delta calculation.

12. The transmitting method according to claim 7, wherein the generating of the first enable signal or the generating of the second enable signal is performed by a smoothing operation other than a sigma-delta calculation.

\* \* \* \* \*